United States Patent [19]

Fundak

[11] Patent Number: 5,047,709
[45] Date of Patent: Sep. 10, 1991

[54] CALIBRATED VOLTAGE CURSORS

[75] Inventor: Davorin Fundak, Aloha, Oreg.

[73] Assignee: Tektronix, Inc., Beaverton, Oreg.

[21] Appl. No.: 465,859

[22] Filed: Jan. 16, 1990

[51] Int. Cl.⁵ ............................................. G01R 35/00
[52] U.S. Cl. ................................ 324/121 R; 340/706; 340/734
[58] Field of Search ................. 340/706, 734; 324/115, 324/116, 121 R; 315/377

[56] References Cited

U.S. PATENT DOCUMENTS

| | | | |
|---|---|---|---|
| 4,092,567 | 5/1978 | Sharrit | 315/377 |
| 4,550,316 | 10/1985 | Whetstone et al. | 340/709 |
| 4,553,091 | 11/1985 | Bristol | 324/115 |
| 4,737,773 | 4/1988 | Kobayashi | 340/706 |
| 4,748,404 | 5/1988 | Heinze et al. | 324/115 |
| 4,754,205 | 6/1988 | Diller et al. | 315/377 |

OTHER PUBLICATIONS

"Digital Cursor Generator for Video Displays", by Brock et al, IBM Tech. Disc. Bull., vol. 19, #6, 11/76, p. 1995.

Primary Examiner—Kenneth A. Wieder
Assistant Examiner—William J. Burns
Attorney, Agent, or Firm—Francis I. Gray

[57] ABSTRACT

Calibrated voltage cursors with respect to an input waveform signal are produced for display with the input waveform signal by injecting the cursor signals into the signal path prior to any gain stages in the signal path.

2 Claims, 1 Drawing Sheet

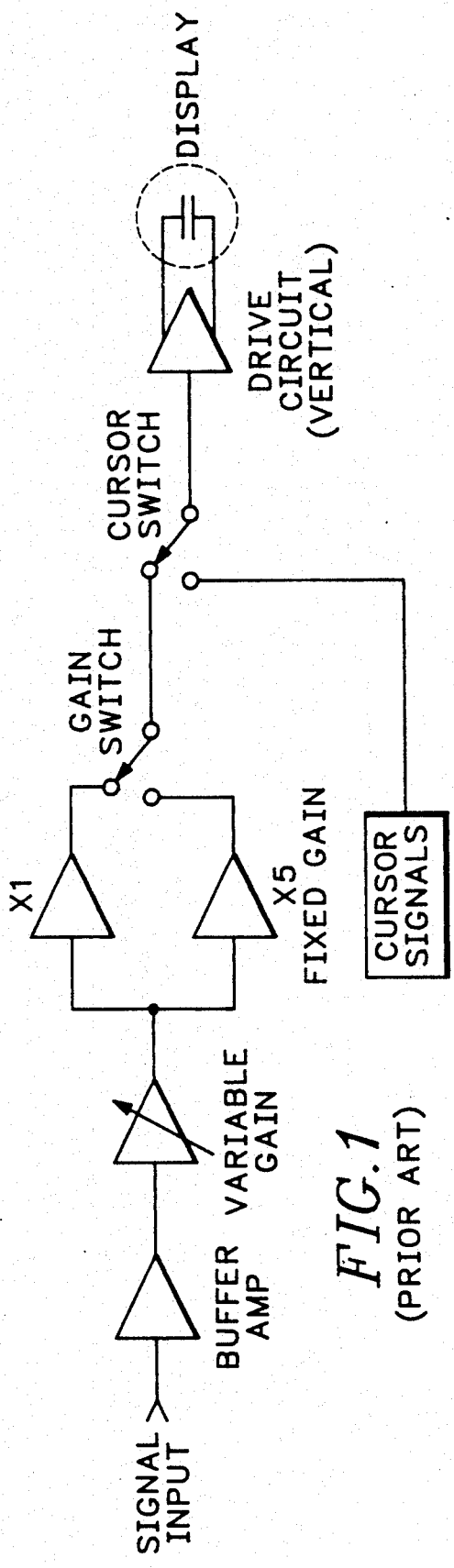
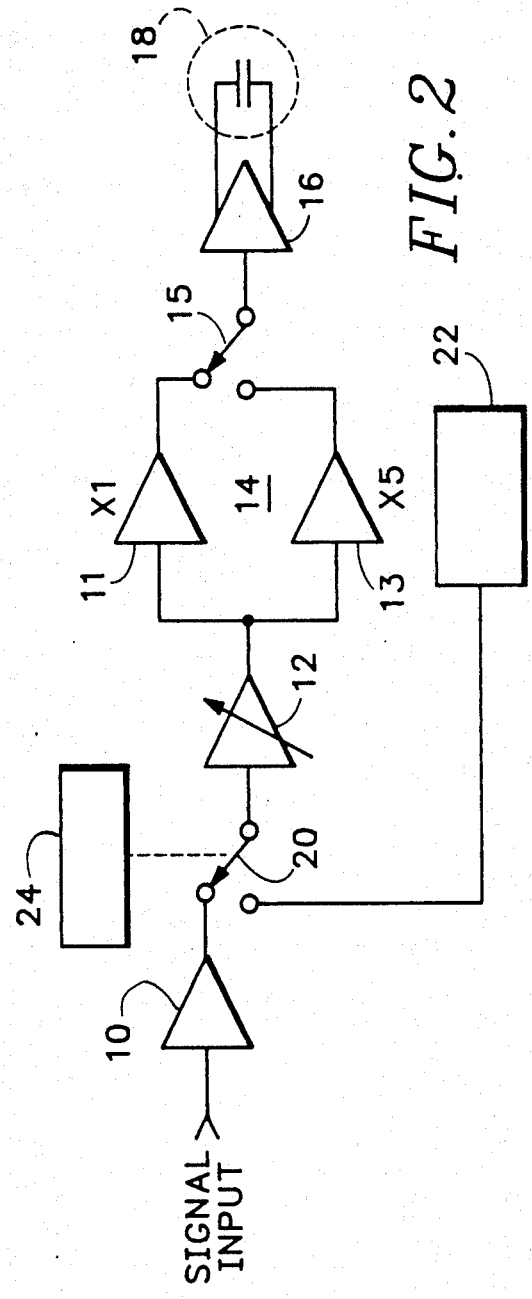

CALIBRATED VOLTAGE CURSORS

BACKGROUND OF THE INVENTION

The present invention relates to voltage cursors for oscilloscopes and waveform monitors, and more particularly to calibrated voltage cursors that maintain calibration with respect to a displayed signal regardless of the gain setting, variable or fixed, for the displayed signal.

Voltage cursors on oscilloscopes and waveform monitors have typically been inserted into a signal path after any fixed or variable gain stage that acts on the signal. Consequently the voltage cursors remain on screen independently of signal gain and position, and are useful only with the portion of the signal that is on screen. Once variable gain is enabled, the cursor scale factor becomes uncalibrated. Calibrated offsets in oscilloscopes and in differential comparators are inserted ahead of variable and fixed gain stages, however these are not cursors for display with a signal being measured.

Therefore what is desired are calibrated voltage cursors that maintain calibration with respect to a displayed signal being measured regardless of the gain setting.

SUMMARY OF THE INVENTION

Accordingly the present invention provides calibrated voltage cursors for an oscilloscope or waveform monitor that are inserted into a signal path prior to any gain stage. An input signal to be measured is input to a switch where it is combined with voltage cursor signals. The output of the switch is input to a variable gain stage so that the signal and cursors are amplified together. The amplified signal and cursor signals are then used to drive the vertical deflection circuitry of a display device, resulting in voltage cursors calibrated to the input signal regardless of the gain setting.

The objects, advantages and other novel features of the present invention are apparent from the following detailed description when read in conjunction with the appended claims and attached drawing.

BRIEF DESCRIPTION OF THE DRAWING

FIG. 1 is a block diagram of a prior art voltage cursor topology.

FIG. 2 is a block diagram of a calibrated voltage cursor topology according to the present invention.

DESCRIPTION OF THE PREFERRED EMBODIMENT

Referring now to FIGS. 1 and 2 the basic difference in topology between the prior art and the present invention is apparent. An input waveform signal is coupled to a buffer amplifier 10. The signal path flows through a variable gain stage 12 and a fixed gain stage 14 to a vertical drive amplifier 16 that provides an amplitude variation on a display device 18 corresponding to the input signal as modified by the various amplifier and gain stages. A gain switch 15 is used to select between the individual fixed gain amplifiers 11, 13, and a cursor switch 20 is used to switch a cursor signal from a cursor generator 22 into the signal path. The cursor switch 20 is controlled by appropriate circuitry 24 so that the cursor signal and the input waveform signal appear on the display device 18 apparently simultaneously. Contrary to the prior art circuitry of FIG. 1, the location of the cursor switch 20 is situated prior to the variable gain stage 12 rather than after all the gain stages 12, 14. The result is that a digital readout on the display device 18 of the cursor differential between two cursors always displays the separation between the cursors in a voltage or decibel value, or an IRE value for television applications where desired.

As an example in a television application if a pulse-to-bar measurement is desired, the measurement is selected from a front panel. The two vertical cursors from the cursor generator 22 are positioned, one on the back porch of a television signal shown on the display 18 and the other on the bar. A normalize function produces a readout of 100%. Then moving the upper cursor from the bar to the pulse top produces a pulse-to-bar readout directly in percent regardless of the gain settings of the variable and fixed gain stages 12, 14. For most accurate results each cursor may be place independently by increasing the gain so that only a portion of the signal where one cursor is to be positioned is displayed at a time. Since the cursors are calibrated with the signal, the waveform signal position may be adjusted to position the other cursor, even though such repositioning causes the first cursor to be moved out of the display area. Other measurements may be made in the same manner, i.e., placing one cursor at one level of the input signal waveform and the other at another level to produce a readout in voltage units regardless of the gain settings, the voltage units being convertible into other units such as percentage, dB or IRE.

Although the present invention has been described in terms of an embodiment for producing calibrated voltage cursors in the vertical direction, the invention may also be used for calibrated horizontal, or time, cursors also by inserting the horizontal cursor signal prior to the horizontal deflection gain stages.

Thus the present invention provides calibrated cursors for display by inserting the cursor signal prior to the gain stages so that the cursor signal is amplified by the same amount as the input signal being measured.

What is claimed is:

1. An apparatus for providing calibrated cursors on a display together with an input signal comprising:
   an input signal path for receiving and processing the input signal;
   means for displaying the output of the input signal path on the display; and
   means for injecting a cursor signal into the input signal path prior to any gain stage in the input signal path.

2. An improved apparatus for providing cursors on a display together with an input signal, the apparatus being of the type having an input signal path for receiving and processing the input signal and having means for displaying the output of the input signal path, the improvement comprising means for injecting the cursors into the input signal path prior to any gain stage in the input signal path so that the cursors remain calibrated with respect to the input signal regardless of gain variations introduced into the input signal path.

* * * * *